United States Patent
Hartley et al.

(10) Patent No.: US 11,615,938 B2
(45) Date of Patent: Mar. 28, 2023

(54) HIGH-RESOLUTION MULTIPLE BEAM SOURCE

(71) Applicants: NuFlare Technology, Inc., Kanagawa (JP); NuFlare Technology America, Inc., Sunnyvale, CA (US)

(72) Inventors: John Hartley, Hopewell Junction, NY (US); Victor Katsap, Hopewell Junction, NY (US)

(73) Assignees: NuFlare Technology, Inc., Kanagawa (JP); NuFlare Technology America, Inc., Sunnyvale, CA (US)

( * ) Notice: Subject to any disclaimer, the term of this patent is extended or adjusted under 35 U.S.C. 154(b) by 40 days.

(21) Appl. No.: 16/723,698

(22) Filed: Dec. 20, 2019

(65) Prior Publication Data
US 2021/0193428 A1    Jun. 24, 2021

(51) Int. Cl.
  *H01J 37/09*  (2006.01)
  *H01J 37/26*  (2006.01)
(52) U.S. Cl.
  CPC .............. *H01J 37/09* (2013.01); *H01J 37/26* (2013.01); *H01J 2237/0453* (2013.01)
(58) Field of Classification Search
  CPC .......................... H01J 37/09; H01J 2237/0453
  USPC ...................................................... 250/398
  See application file for complete search history.

(56) References Cited

U.S. PATENT DOCUMENTS

| | | | | |
|---|---|---|---|---|
| 6,858,521 | B2 * | 2/2005 | Jin | H01J 9/025 313/310 |
| 7,595,490 | B2 * | 9/2009 | Zhou | H01J 37/073 250/310 |
| 9,653,254 | B2 * | 5/2017 | Zeidler | B82Y 10/00 |
| 10,242,839 | B2 * | 3/2019 | Brodie | H01J 37/09 |
| 10,274,537 | B2 * | 4/2019 | Yeh | H01J 37/28 |
| 10,600,613 | B2 * | 3/2020 | Zeidler | H01J 37/10 |
| 2021/0210303 | A1 * | 7/2021 | Zeidler | H01J 37/244 |
| 2022/0013327 | A1 * | 1/2022 | Sugihara | G06T 7/001 |
| 2022/0106875 | A1 * | 4/2022 | Frith | H04B 11/00 |
| 2022/0108864 | A1 * | 4/2022 | Zeidler | H01J 37/05 |

OTHER PUBLICATIONS

H. S. Kim et al., "Miniature Schottky electron source", J. Vac. Sci. Technol. B 13(6), Nov./Dec. 1995, pp. 2468-2472.
Taiwanese Office Action dated Oct. 5, 2021 in Taiwanese Application No. 109126818 with English translation, 14 pgs.
Office Action dated May 16, 2022 in corresponding Korean Application No. 10-2020-0107022, along with an English translation (16 pgs).

* cited by examiner

*Primary Examiner* — Wyatt A Stoffa
(74) *Attorney, Agent, or Firm* — Oblon, McClelland, Maier & Neustadt, L.L.P.

(57) ABSTRACT

A thermal field emitter, an apparatus, and a method for generating multiple beams for an e-beam tool are provided. The thermal field emitter includes an electron emitting portion configured to emit an electron beam and a nano-aperture array (NAA) having a plurality of openings. The NAA is positioned in a path of the electron beam. The NAA is configured to form multiple beams. The multiple beams include electrons from the electron beam that pass through the plurality of openings.

18 Claims, 5 Drawing Sheets

HIGH-RESOLUTION MULTIPLE BEAM SOURCE

BACKGROUND

1. Field

This invention generally relates to a high resolution multiple beam source. In particular, the invention provides a beam source for electron beam (e-beam) technologies having a nano-aperture array.

2. Background

In an e-beam tool, a high brightness source (e.g., a thermal field emitter (TFE)) is used to generate an electron beam. The source is imaged onto a sample surface. A resolution of the e-beam tool is inversely proportional to a size of the electron beam. However, the smaller the beam, the longer the time that is needed to scan the sample surface. E-beam lithography tools having multiple beams may be used and information is read in parallel to improve the speed of the tool.

Existing e-beam tools (e.g., lithographic tools, probes, free electron lasers, and electron and ion guns) and characterization tools (e.g., scanning electron microscopes (SEMs) and transmission electron microscopes (TEMs)) that use multiple beams create multiple images of the source and then de-magnify an array of the multiple images onto a target plane.

These systems, however, have disadvantages. The multiple images of the TFE source are affected by imaging optics aberrations, misalignment effects, and space charge effects caused by the instability of the TFE source (e.g., temporal and spatial instability of the Schottky source). The multiple images are relatively large, which restricts the resolution of the system. Further, the multiple images being images of the TFE source tend to change or drift as the TFE source changes and/or drifts. Thus, the system requires constant monitoring and frequent adjustments/re-alignments.

Accordingly, what is needed, as recognized by the present inventors, is an electron source that can provide multiple beams that are not affected by the electron source stability and therefore are capable of stable multi-beam array at the target plane.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention.

SUMMARY

The present disclosure relates to a thermal field emitter (TFE). The thermal field emitter includes an electron emitting portion configured to emit an electron beam and a nano-aperture array (NAA) having a plurality of openings. The NAA is positioned in a path of the electron beam. The NAA is configured to form multiple beams. The multiple beams comprise electrons from the electron beam that pass through the plurality of openings The present disclosure also relates to an apparatus for forming multiple beams. The apparatus includes a thermal field emitter configured to emit an electron beam; and at least one nano-aperture array (NAA) having a plurality of openings. The at least one NAA is placed in a path of the electron beam proximate to an electron emitting end of the thermal field emitter. The electron beam passes through the plurality of openings of the at least one NAA to form multiple beams.

The present disclosure also relates to a method of generating multiple beams for an e-beam tool. The method includes providing an electron beam from a thermal field emitter and providing a nano-aperture array (NAA) having a plurality of openings. The NAA is positioned in a path of the electron beam proximate to an emitting end of the thermal field emitter. The method also includes passing the electron beam through the NAA to form a plurality of electron beams.

The foregoing paragraphs have been provided by way of general introduction, and are not intended to limit the scope of the claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1A:
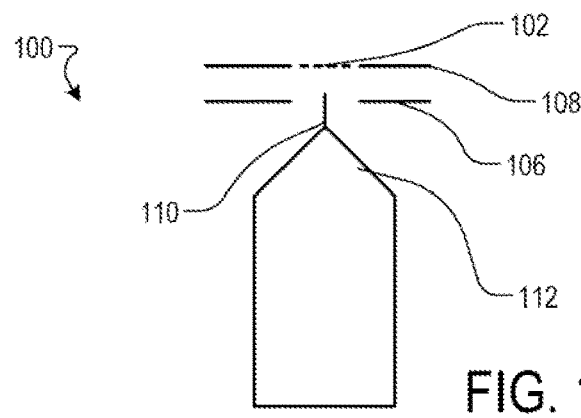
FIG. 1A is a schematic that shows a thermal field emitter (TFE) source according to one example.

Referring now to the drawings, wherein like reference numerals designate identical or corresponding parts throughout several views, the following description relates to a multiple beam source, an apparatus, and associated methodology for electron beam (e-beam) technologies.

The multiple beam source described herein provides stable multiple beams that are not affected by the instability of an electron source. The multiple beams are generated by passing an electron beam via nano-holes of a nano-aperture army (NAA) as described further below.

FIG. 1A is a schematic that shows a thermal field emitter (TFE) source 100 according to one example. The TFE source 100 includes a NAA 102, a suppressor electrode 106, and an extractor electrode 108. The TFE source 100 can be a miniature cold-field or Schottky emitter having a field emitter tip 110 (i.e., an electron emitting portion). The Schottky source has very high brightness. The brightness may be in a range from about $5 \times 10^7$ $Acm^{-2}sr^{-1}$ to $2 \times 10^8$ $Acm^{-2}sr^{-1}$. The suppressor electrode 106 may include an aperture through which the field emitter tip protrudes. The field emitter tip 110 can be a Zr/O/W Schottky-type emitter tip 110 or a single-crystal tungsten, hafnium carbide, diamond tip, or the like. The field emitter tip 110 may be coated with zirconium oxide. The field emitter tip 110 is attached to a tungsten filament 112. The tungsten filament 112 is connected to a filament-heating power source (not shown). Electrons are emitted from the field emitter tip 110 due to both thermal excitation and the electric field at the field emitter tip 110. The electrons form an electron beam that passes through a hole of the extractor electrode 108 (FIG. 1B) or the plurality of holes (openings) of the NAA 102 (FIG. 1A) as described further below. The field emitter tip 110 is aligned with the NAA 102.

In one implementation, the NAA 102 serves as the extractor electrode 108 as shown in FIG. 1A. For example, the NAA 102 may be connected to ground. In other examples, the NAA 102 may be in direct contact with the extractor electrode 108. For example, the NAA 102 may be attached to the top side or the bottom side of the extractor electrode 108.

Figure 1B:
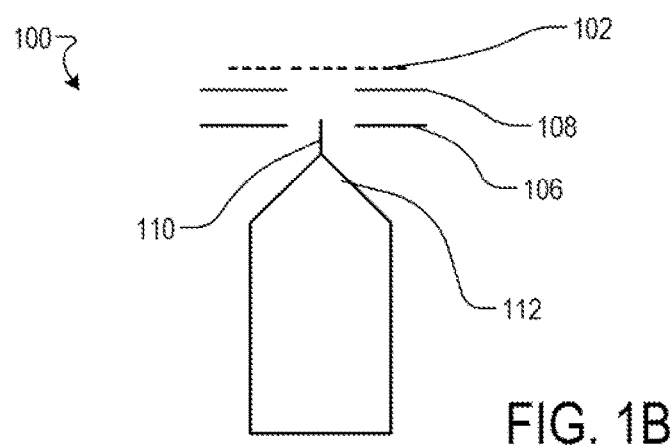
FIG. 1B is a schematic that shows the TFE source according to another example.

In one implementation, the NAA 102 may be positioned in a path of the electron beam after the suppressor electrode 106 thus representing extractor electrode. The NAA 102 may be oriented parallel to the suppressor electrode 106 in the direction of the path of the electron beam such as a portion of the electron beam passes via two or more holes of the plurality of holes of the NAA 102. For example, the path of the electron beam may be along the z-direction and the NAA 102 positioned in the x-y plane. The NAA 102 may be positioned in the path of the electron beam after the extractor electrode 108 as shown in FIG. 1B. The NAA 102 may be positioned from about 0.5 mm to about 10 mm after the extractor electrode 108 in the path of the electron beam.

Figure 1C:
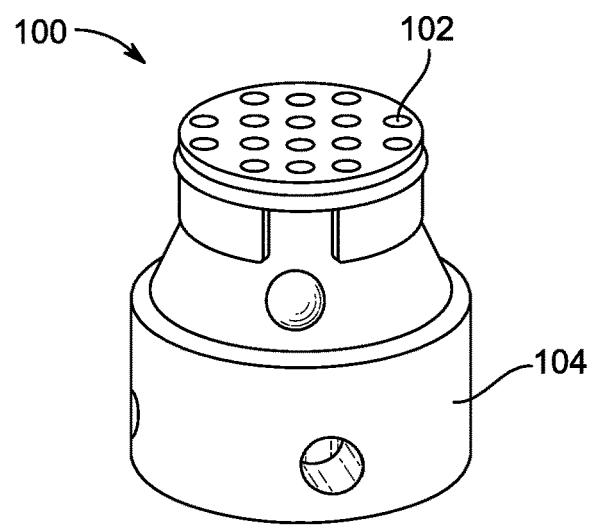
FIG. 1C is a schematic that shows the TFE source according to another example.

An exemplary TFE source 100 also includes a suppressor cylinder 104 as shown in FIG. 1C. The NAA 102 is mounted on a structure that extends from the suppressor cylinder 104. For example, a disk shaped NAA 102 may be used to replace a metal disk that acts as the extractor electrode in known TFE sources. The NAA 102 is electrically connected to a power source to maintain the NAA 102 at a suitable voltage with respect to the suppressor electrode 106 as would be understood by one of ordinary skill in the art.

In one example, the TFE source 100 may be used in an e-beam tool or system. For example, the e-beam system may be an electron microscope. The electron microscope may include a target plane (e.g., a substrate). The TFE source 100 may be positioned such as the NAA 102 is in a plane parallel to the target plane in the z-direction.

Figure 2:
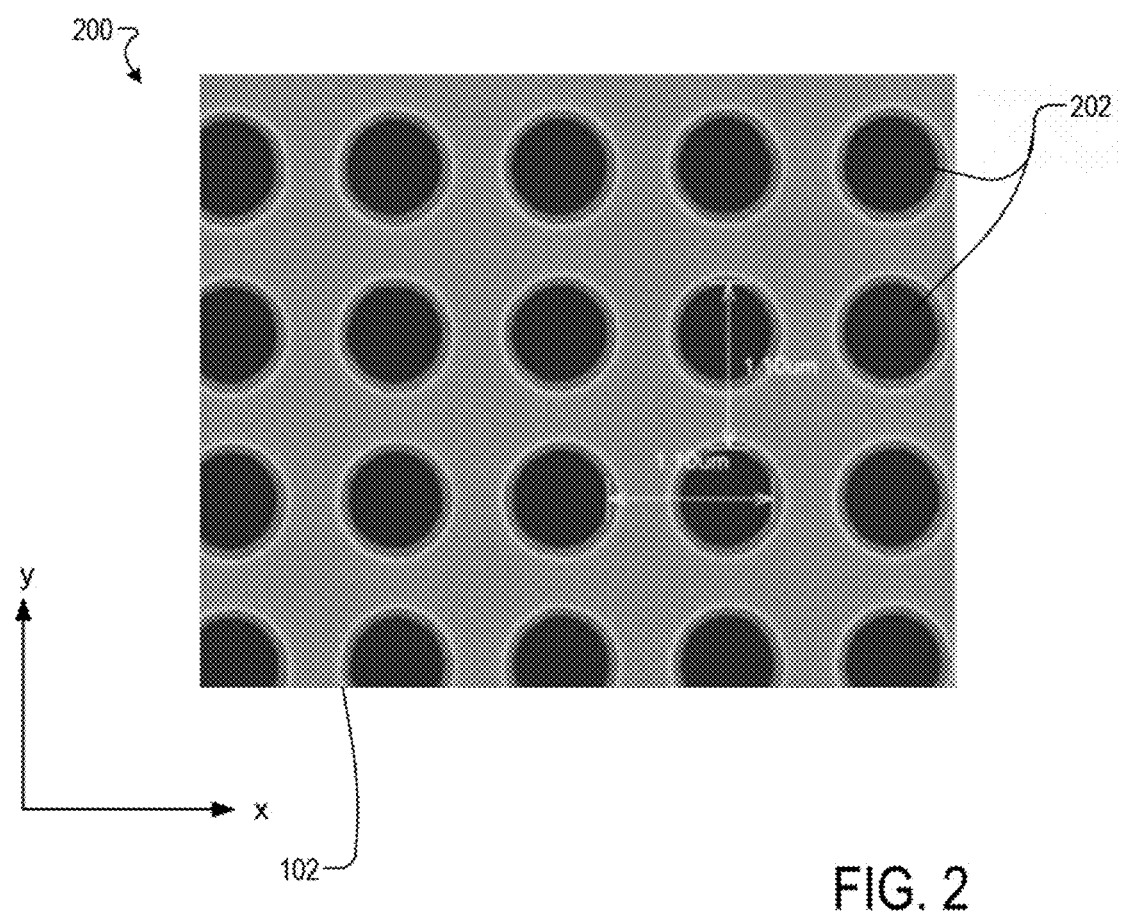
FIG. 2 is a schematic that shows an image of a nano-aperture array (NAA) for the TFE source according to one example.

FIG. 2 is a schematic that shows an image 200 of the NAA 102 according to one example. The NAA 102 includes a plurality of holes 202 or openings having a sub-hundred nanometer size. The holes 202 are arranged in vertical and horizontal directions (i.e., x and y directions) of the NAA 102. In each of the vertical and horizontal directions, two holes or more are arranged.

Figure 3:
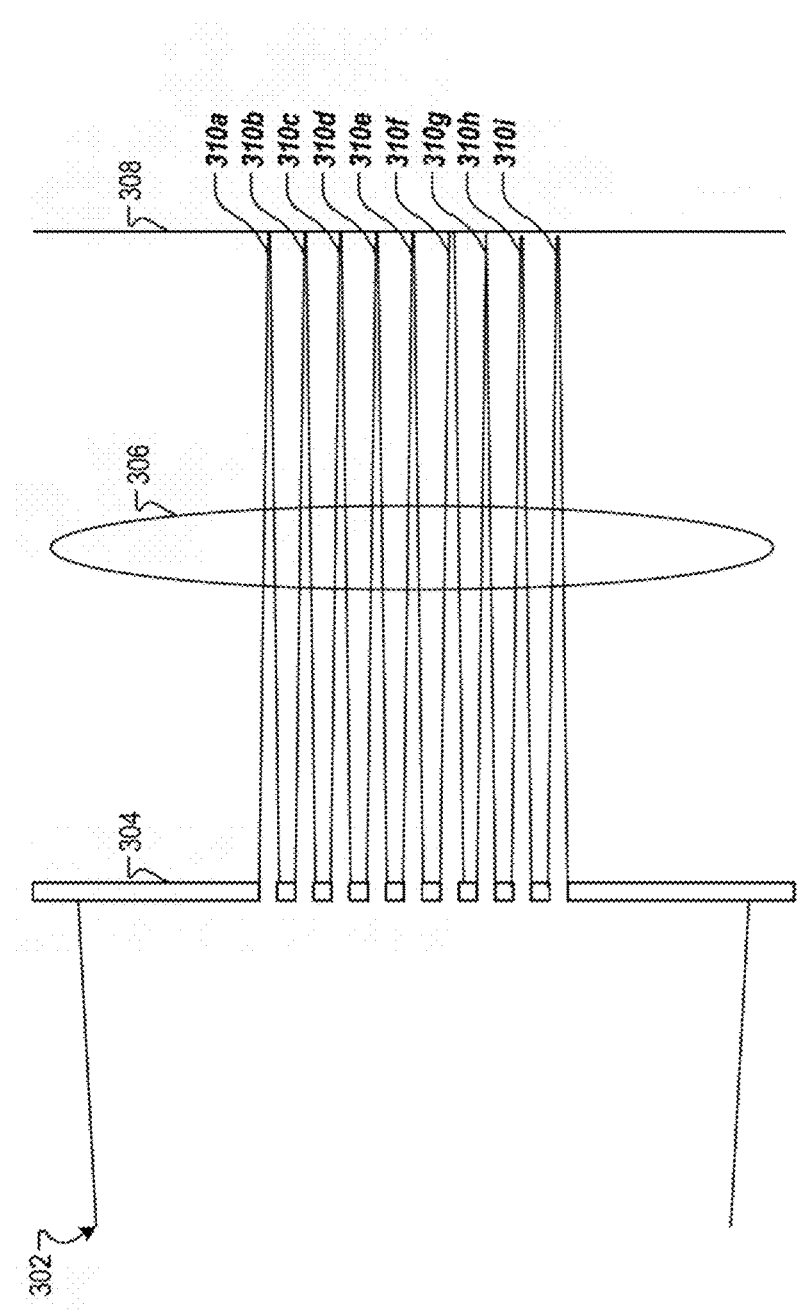
FIG. 3 is a schematic that illustrates a single NAA arrangement according to one example.

In FIG. 3, the NAA 102 is positioned in the path of the electron beam between the suppressor electrode 106 and an illumination lens the e-beam tool. As discussed previously herein, the NAA is positioned parallel to the target plane of the e-beam tool. The electron beam illuminates an input side of the NAA 102. On an output side of the NAA 102, multiple beams are formed. Portions of the electron beam pass through each hole of the NAA 102 thus forming the multiple beams. The number of the multiple beams corresponds to the number of holes in the NAA 102. The NAA 102 is positioned close to the Schottky source such as to maximize the efficiency of the system. The efficiency is maximized because more electrons pass through the plurality of openings as the beam did not diffract as opposed of placing NAA 102 further away from the source. The NAA 102 may be positioned from about 0.25 mm to about 1 mm, from about 0.3 mm to about 0.75 mm from the field emitter tip in the path of the electron beam. For example, a distance between the NAA 102 and a free end of the field emitter tip 110 is equal to 500 microns. Due to the small distance between the NAA 102 and the field emitter tip 110, each of the newly formed multiple beams provides a desired current based on the requirement of the system (i.e., scanning electron microscopes (SEMs) and transmission electron microscopes (TEMs)). For example, a current of each of the multiple beams may be from about 0.1 nA to about 1 nA.

The holes are formed (i.e., drilled, etched, created, or obtained) in a planar substrate, a membrane, a sheet, or a plate. The substrate may have a circular shape. The holes 202 may be formed using ion beam technology, for example, via focused ion beam (FIB) or reactive ion etching. The sheet is thin so to have sharp edge for the holes and to minimize scattering from the wall of the holes. The NAA 102 may have a thickness in a range from about 10 nm to about 100 nm. The NAA 102 may be mounted by securing the NAA to a carrier (e.g., substrate) by brazing, gluing, lamination, or mechanical compression.

In one implementation, the NAA 102 is made of silicon nitride ($Si_3N_4$) or Si. The plurality of holes (openings) may be formed in a $Si_3N_4$ membrane by reactive ion etching. The $Si_3N_4$ membrane may be fabricated by etching a silicon beam. The $Si_3N_4$ membrane is robust. See, C. J. Martin, W. H. Semke, G. A. Dicks, R. L. Engelstad, and E. G. Lovell, Mechanical and thermal modeling of the SCALPEL mask, Journal of Vacuum Science & Technology B: Microelectronics and Nanometer Structures Processing, measurement, and Phenomena 17, 2878 (1999). The $Si_3N_4$ membrane is mounted onto Si-substrate, therefore preserving flatness.

In one implementation, a thickness of the $Si_3N_4$ membrane is 20 nanometers.

In one implementation, the NAA 102 is made of a metal film (e.g., platinum or molybdenum). FIB may be used to form (drill) the nano-holes in the metal film. The metal film thickness may vary. A thick metal film may be used when collimated multiple beams are desired. The thickness of the metal film may be in a range from about 150 nm to about 500 nm. A thin metal film may be used when a larger angle of the beam is desired to pass through the plurality of openings. A thickness for the thin metal film may be in a range from about 50 nm to about 100 nm.

The holes 202 may have a circular shape having a diameter in a range from about 50 nm to about 500 nm. Each of the holes 202 in the NAA 102 may have a same diameter, for example, 50 nm, 70 nm, 80 nm, or 100 nm. In one implementation, the holes 202 may have a rectangular shape, with each of the holes 202 in the NAA 102 having the same dimensions. In one implementation, the holes 202 in the NAA 102 may have different dimensions.

The holes 202 may be arranged in a periodical pattern. For example, the pattern may be any geometric pattern, such as a square pattern, a rectangular pattern, a triangular pattern, a honeycomb pattern, or the like, as understood by one of ordinary skill in the art. The holes 202 may also be arranged in a honeycomb pattern or in a hexagonal pattern. A periodicity of the holes 202 may be equal to about 1.10 microns, for example, as depicted in FIG. 2.

In one implementation, the NAA 102 includes 100 holes 202 in a 10×10 matrix array. The 10×10 matrix array is positioned in the path of the electron beam. Therefore, a 10×10 matrix array of beams are created on the output side of the NAA 102. A portion of the electron beam passes by each of the 100 holes of the 10×10 matrix array to form the 10×10 matrix array of beams.

FIG. 3 is a schematic that illustrates a single NAA arrangement according to one example. As shown in FIG. 3, an electron beam 302 passes through the multiple holes in the NAA 304. Some electrons pass through and form multiple beams (310a, 310b, 310c, 310d, 310e, 310f, 310g, 310h, 310i). Each beam of the multiple beams has a diameter, at an output side of the NAA 304, corresponding to a diameter of each hole of the multiples holes. The multiple beams are focused on a target plane 308 via the optical system 306. Thus, a cross section of each beam of the multiple beams at the target plane 308 is reduced with respect to a size of a respective hole in the NAA 304. The optical system 306 includes electrostatic and/or magnetic lenses as would be understood by one of ordinary skill in the art.

In one implementation, two or more NAAs may be used to generate the multiple beams. The NAA's are positioned parallel to each other along the path of the electron beam in a beam column of the system. The two or more NAAs have different hole sizes in order to maximize the current of each electron beam that passes through the one or more NAAs and reaches the target plane. The NAA having the largest hole size is placed adjacent to the TFE source 100. Thus, the size of the holes associated with each NAA decreases in the direction of the path of the electron beams towards the target plane. Optical systems are placed between the NAAs to focus the beam onto the holes of a subsequent NAA. Thus, high current beams are pushed into the smaller holes of the subsequent NAA because current is not lost when the beams are passed through the subsequent NAA due to the small size (i.e., more electrons pass through the hole because the beam is focused). Double, triple, or quadruple current in each individual final beam (i.e., electron beams after passing through the two or more NAAs) is obtained compared with a single NAA arrangement while maintaining the desired final spot size for each electron beam. A double NAA arrangement is shown in FIG. 4.

Figure 4:
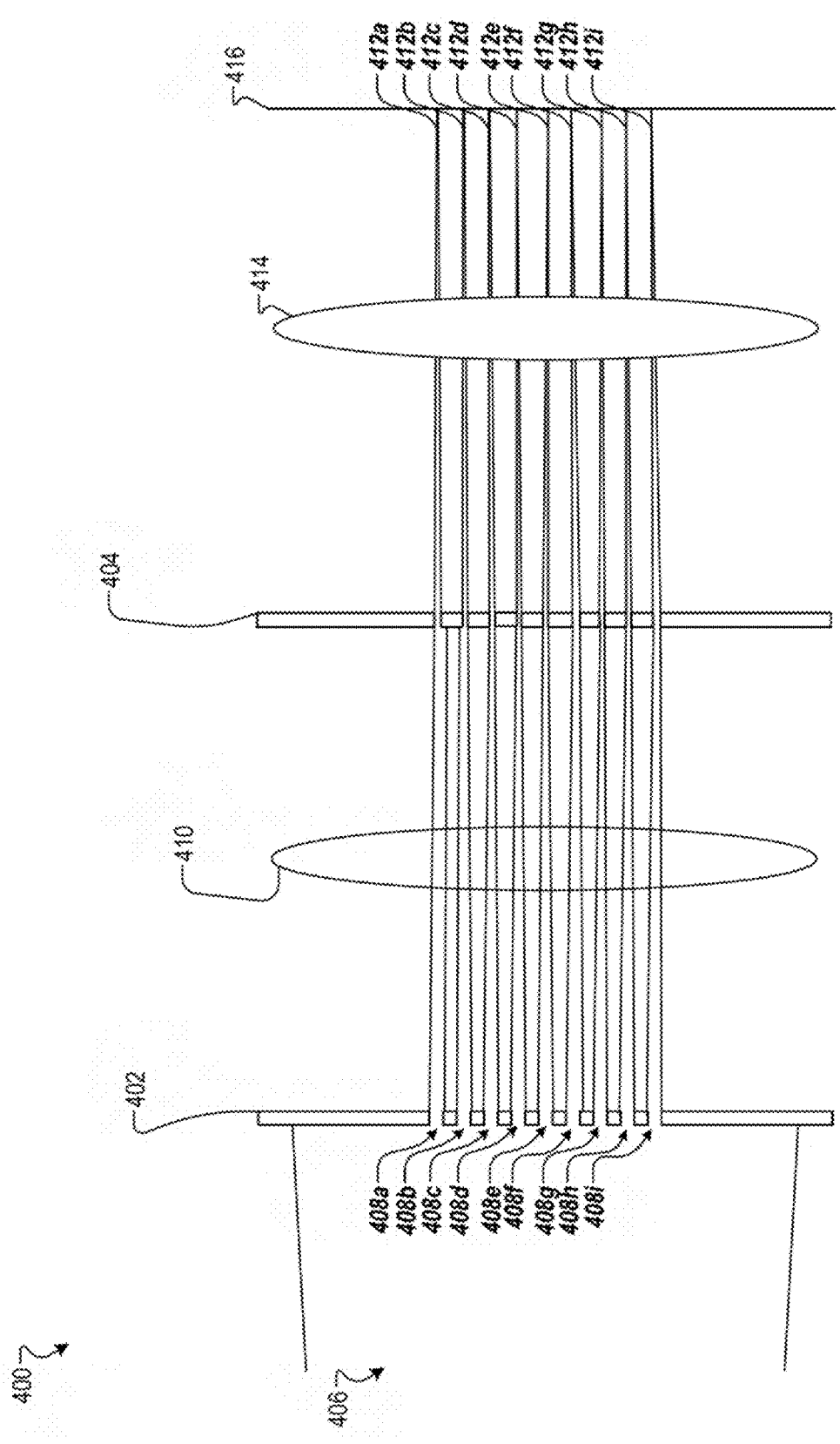
FIG. 4 is a schematic that illustrates a double NAA arrangement according to one example.

FIG. 4 is a schematic that illustrates a double NAA arrangement according to one example. The double NAA system 400 includes an upper NAA 402 and a lower NAA 404. The size of the openings or holes of the lower NAA 404 are smaller than the size of the openings or holes of the upper NAA 402. An electron beam 406 from the TFE source (not shown) passes the plurality of holes in the upper NAA 402. The electron beam 406 illuminates multiple or all of the plurality of openings of the upper NAA 402. Some electrons pass through and form multiple beams (408a, 408b, 408c, 408d, 408e, 408f, 408g, 408h, 408i). The multiple beams are focused onto the lower NAA 404 via a first optical system 410. The focused multiple beams pass through the openings of the lower NAA 404 to form beams (412a, 412b, 412c, 412d, 412e, 412f, 412g, 412h, 412i). This provides the advantage of pushing high current beams into small holes which magnify the current in each of the final beams (i.e., 412a, 412b, 412c, 412d, 412e, 412f, 412g, 412h, 412i). The current of each of final beams 412a, 412b, 412c, 412d, 412e, 412f, 412g, 412h, 412i) is higher than the current of each of the electron beams (408a, 408b, 408c, 408d, 408e, 408f, 408g, 408h, 408i) due to the larger hole size of NAA 402. Then, each of the electron beams is focused via the first optical system 410 into the holes of the lower NAA 404. Because the electron beams are focused, a greater number of electrons passes through the holes of the lower NAA. The beams (i.e., 412a, 412b, 412c, 412d, 412e, 412f, 412g, 412h, 412i) are focused on a target plane 416 via a second optical system 414.

A typical requirement for an e-beam tool is a final spot size of about 10 nanometers or less. Advanced e-beam tools have a final spot size of about two or three nanometers. Optical systems used to focus the beams in e-beam tools have a magnification power of ×50 to ×60. Thus, to obtain a final spot size of about 2 nanometers the holes of the lower NAA 404 may have a diameter of 100 nanometers or less. The holes of the upper NAA 402 may have a diameter of 200 nanometers.

In one implementation, the holes of the lower NAA 404 have a diameter in the range from about 50 nanometers to about 100 nanometers, e.g., 50 nm, 60 nm, 70 nm, 80 nm, 90 nm, or 100 nm. A diameter of the holes of the upper NAA 402 is in the range from 150 nm to about 300 nm, e.g., 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, or 300 nm.

Figure 5:
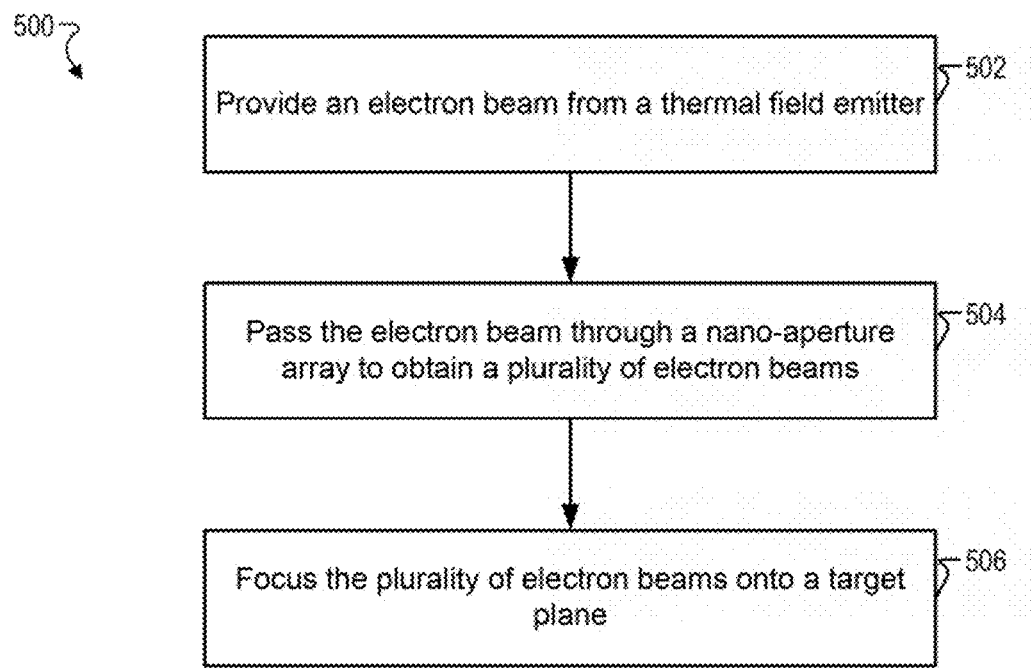
FIG. 5 is a flowchart for a method for providing a high resolution multiple beam source according to one example.

FIG. 5 is a flowchart that shows a method 500 for obtaining multiple beams for an e-beam tool according to one example. At step 502, an electron beam from a TFE source is provided.

At step 504, the electron beam is passed via nano-holes of one or more NAAs to form a plurality of beams. The one or more NAAs are positioned near the TFE source in the path of the electron beam. The NAA is a 2D NAA including an array of nano-holes.

At step 506, the plurality of beams is focused on a target plane via an optical system. In one implementation, the electron beam is passed via a first NAA and a second NAA. The optical system may focus the plurality of beams generated by the first NAA into nano-holes of a second NAA positioned downstream from the first NAA along the path of the electron beam.

The features of the present disclosure provide a multitude of improvements in the field of e-beam lithography. In particular, the multiple beams created are not source images and therefore are not affected by the instability of the TFE source. Thus, the system and method described herein provide a stable current for each individual beam and a stable virtual electron source size.

Numerous modifications and variations are possible in light of the above disclosure. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:
1. A thermal field emitter, comprising:
an electron emitting portion configured to emit an electron beam via electric field applied to an emitter tip of the electron emitting portion;

a suppressor electrode having an aperture through which the emitter tip of the electron emitting portion protrudes;

an extractor electrode positioned in a path of the electron beam;

a first nano-aperture array (NAA) having a plurality of openings, the first NAA being positioned in the path of the electron beam; and a second NAA placed parallel to the first NAA in the path of the electron beam and having a plurality of openings that have a smaller diameter than a diameter of the plurality of openings of the first NAA, wherein the first NAA is configured to form multiple beams that include electrons from the electron beam, the multiple beams formed by the first NAA pass via the plurality of openings of the second NAA, and a current of the multiple beams remains consistent from before passing via the plurality of openings of the second NAA to after passing via the plurality of openings of the second NAA.

2. The thermal field emitter of claim 1, wherein the first NAA is positioned proximate to the extractor electrode.

3. The thermal field emitter of claim 1, wherein the first NAA serves as the extractor electrode.

4. The thermal field emitter of claim 1, wherein each opening of the plurality of openings of the first NAA and the second NAA has a circular shape.

5. The thermal field emitter of claim 4, wherein each opening of the first NAA has a diameter in a range from 20 nm to 300 nm.

6. The thermal field emitter of claim 1, wherein the first NAA is made of silicon nitride.

7. The thermal field emitter of claim 1, wherein the first NAA is made of metal.

8. The thermal field emitter of claim 1, wherein each opening of the second NAA has a diameter in a range from 50 nm to 100 nm.

9. The thermal field emitter of claim 1, wherein the current of the multiple beams is not lost from passing via the plurality of openings of the second NAA.

10. An apparatus for forming multiple beams, comprising:
a thermal field emitter configured to emit an electron beam via electric field applied to an electron emitting end of the thermal field emitter;
a suppressor electrode having an aperture through which the electron emitting end of the thermal field emitter protrudes;
an extractor electrode positioned in a path of the electron beam;
a first nano-aperture array (NAA) having a plurality of openings, the first NAA being placed in a path of the electron beam proximate to the electron emitting end of the thermal field emitter; and
a second NAA placed parallel to the first NAA in the path of the electron beam and having a plurality of openings that have a smaller diameter than a diameter of the plurality of openings of the first NAA, wherein
the electron beam passes through the plurality of openings of the first NAA to form multiple beams,
the multiple beams formed by the first NAA pass via the plurality of openings of the second NAA, and
a current of the multiple beams remains consistent from before passing via the plurality of openings of the second NAA to after passing via the plurality of openings of the second NAA.

11. The apparatus of claim 10, wherein the plurality of openings of the first NAA and the second NAA have a circular shape.

12. The apparatus of claim 10, wherein each opening of the plurality of openings of the first NAA has a diameter in a range from 150 nm to 300 nm and each opening of the plurality of openings of the second NAA has a diameter in a range from 50 nm to 100 nm.

13. The apparatus of claim 10, further comprising:
an optical system configured to focus the multiple beams into each opening of the plurality of openings of the second NAA.

14. The apparatus of claim 10, wherein the plurality of openings of the first NAA have a periodical pattern.

15. The apparatus of claim 13, wherein
the current with respect to size of each of the multiple beams exiting the optical system is greater than its current with respect to size entering the optical system, and
the current of the multiple beams exiting the optical system and passing via the plurality of openings of the second NAA remains consistent from before passing via the plurality of openings of the second NAA to after passing via the plurality of openings of the second NAA.

16. The apparatus of claim 15, wherein
the current with respect to size of each of the multiple beams exiting the optical system is double than its current with respect to size entering the optical system, and
the current of the multiple beams exiting the optical system and passing via the plurality of openings of the second NAA remains consistent from before passing via the plurality of openings of the second NAA to after passing via the plurality of openings of the second NAA.

17. A method for generating multiple beams for an e-beam tool, comprising:
providing an electron beam from a thermal field emitter via electric field applied to an electron emitting end of the thermal field emitter;
providing a suppressor electrode having an aperture through which the electron emitting end of the thermal field emitter protrudes;
providing an extractor electrode positioned in a path of the electron beam;
providing a first nano-aperture array (NAA) having a plurality of openings, the first NAA being positioned in the path of the electron beam proximate to the electron emitting end of the thermal field emitter;
providing a second NAA placed parallel to the first NAA in the path of the electron beam and having a plurality of openings that have a smaller diameter than a diameter of the plurality of openings of the first NAA;
passing the electron beam through the first NAA to form a plurality of electron beams;
passing the multiple beams formed by the first NAA through the plurality of openings of the second NAA, wherein a current of the multiple beams remains consistent from before passing through the plurality of openings of the second NAA to after passing through the plurality of openings of the second NAA.

18. The method of claim 17, further comprising:
focusing the plurality of electron beams onto the plurality of openings of the second NAA via an optical system.

* * * * *